United States Patent
Stürmer et al.

(10) Patent No.: US 6,440,281 B1
(45) Date of Patent: Aug. 27, 2002

(54) DEVICE FOR THE PREVENTION OF ARCING IN VACUUM SPUTTERING INSTALLATIONS

(75) Inventors: Johann Stürmer, Freigericht; Michael Lübbehusen, Bruchköbel; Gernot Thorn, Hanau, all of (DE)

(73) Assignee: Unaxis Deutschland Holding GmbH, Hanau (DE)

( * ) Notice: Subject to any disclaimer, the term of this patent is extended or adjusted under 35 U.S.C. 154(b) by 0 days.

(21) Appl. No.: 08/384,202

(22) Filed: Feb. 3, 1995

Related U.S. Application Data

(63) Continuation of application No. 08/118,427, filed on Sep. 8, 1993, now abandoned.

(30) Foreign Application Priority Data

Oct. 7, 1992 (DE) .......................................... 42 33 720

(51) Int. Cl.⁷ ............................................... C23C 14/34
(52) U.S. Cl. .............................. 204/298.08; 204/298.06
(58) Field of Search ........................ 204/298.05, 298.06, 204/298.08, 298.34, 192.1, 192.12

(56) References Cited

U.S. PATENT DOCUMENTS

| | | | | |
|---|---|---|---|---|
| 4,464,223 A | * | 8/1984 | Gorin | 156/643 |
| 4,693,805 A | * | 9/1987 | Quazi | 204/298.06 |
| 5,015,493 A | * | 5/1991 | Gruen | 204/298.05 |
| 5,126,033 A | * | 6/1992 | Szczyrbowski et al. | 204/192.12 |
| 5,286,360 A | * | 2/1994 | Szczyrbowski et al. | 204/298.08 |
| 5,300,205 A | * | 4/1994 | Fritsche | 204/192.12 |

FOREIGN PATENT DOCUMENTS

| | | |
|---|---|---|
| DE | 3700633 | 5/1988 |
| DE | 4202425 | 8/1993 |

OTHER PUBLICATIONS

"RF Sputtering Technique", Greiner et al., IBM Tech. Disclosure Bulletin, vol. 17, No. 7, pp. 2172–2173, Dec., 1974.*

"RF Sputtering Technique", Griener et al., IBM Tech. Disclosure Bulletin, vol. 17, No. 7, Dec. 1974 pp. 2172–2173.*

* cited by examiner

*Primary Examiner*—Rodney G. McDonald
(74) *Attorney, Agent, or Firm*—Fulbright & Jaworski L.L.P.

(57) ABSTRACT

The invention relates to a device for the prevention of arcing in vacuum sputtering installations. This device comprises a pulse generator which brings the cathode of the sputtering installation at predetermined intervals to a positive potential, whereby a deposing of layers on a target takes place. This deposing prevents the building-up of high voltages which can lead to arcing.

9 Claims, 2 Drawing Sheets

DEVICE FOR THE PREVENTION OF ARCING IN VACUUM SPUTTERING INSTALLATIONS

SPECIFICATION

This application is a continuation of application Ser. No. 08/118,427, filed Sep. 8, 1993, now abandoned.

BACKGROUND OF THE INVENTION

The invention relates to a device including a DC voltage source whose negative electrode is connected to a cathode and circuit means for periodically imposing a positive potential on the cathode.

In sputtering installations in which a target of a cathode is sputtered by impinging ions, so that the sputtered target particles are deposited on a substrate directly or after preceding chemical combination with other particles, arcing is frequently observed. This arcing occurs as a rule between cathode and anode; however, arcing can also occur between the electrodes and other parts of the installation. Arcing occurs particularly frequently during reactive sputtering of metal oxides or metal nitrides. The reason for this can be found therein that the generation on the target surface of layers which are more or less well-insulating cannot be avoided. These layers, in turn, form small capacitors with the target surface. Since these layers stand exposed to the plasma, they are charged and lastly form an electric field strength of such magnitude that a breakdown occurs causing an arc discharge between cathode and anode. Herefrom result spot destructions of the target and, consequently, layer defects on the substrate.

In order to avoid arcing of this type, it has already been suggested to bring a DC magnet cathode connected to a DC power source with the aid of a matched additional circuit periodically for short periods of time to a positive potential wherein the frequency of the periodic reversal of the poles can be set as a function of the layer to be deposited (German Patent Application 42 02 425.0). The pole reversal is carried out with the aid of four switches of which two can establish a connection between a voltage source and the cathode of the installation, and two a connection between this voltage source and the anode of this installation. As switches can therein be used thyristors which, however, require relatively complicated triggering.

Furthermore is known a process and a device for the careful coating of electrically conducting objects by means of a plasma in which the electrical energy is supplied with periodically repeated DC pulses (German Patent No. 37 00 633). This method is not suited for coating electrically nonconducting substrates.

SUMMARY OF THE INVENTION

The invention is therefore based on the task of simplifying the reversal of poles of an electrode in a DC sputtering installation, in which also electrically nonconducting substrates can be coated or etched.

This task is solved by periodically connecting a second DC power supply to the cathode.

The advantage achieved with the invention resides in particular therein that the substrate-independent internal arcing is suppressed. The power supply feeding the plasma, i.e. supplying it with energy, is not pulsed but rather is a DC power supply. A power supply of this type is simple and inexpensive since the expensive switch is omitted which is necessary with pulse operation. The pulsed power source utilized in "internal arcing" does not supply energy to the plasma. Rather, due to its opposite polarity, it leads to the interruption of the coating process.

BRIEF DESCRIPTION OF THE DRAWINGS

An embodiment example of the invention is depicted in the drawing and will be described in greater detail in the following. Therein show.

DESCRIPTION OF THE PREFERRED EMBODIMENTS

Figure 1:
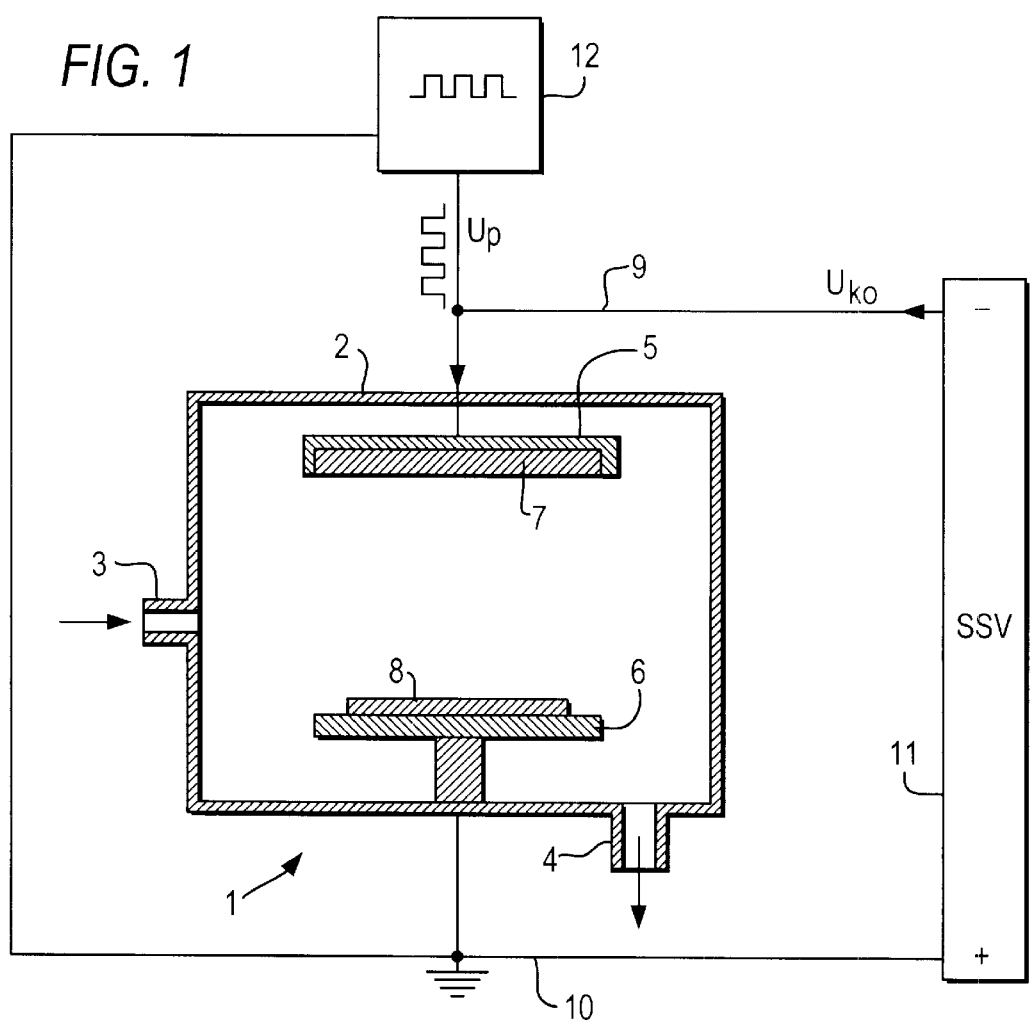
FIG. 1 a basic diagram of a DC sputtering installation with a device according to the invention for the prevention of arcing.

In FIG. 1 is depicted a sputtering installation 1 comprising a housing or chassis 2 which is provided with a gas inlet port 3 and a gas outlet port 4. In the housing 2 are disposed a cathode 5 and an anode 6 opposing one another. The cathode 5 is implemented so as to be pan-form and comprises a target 7 from which particles are ejected during the operation.

On the anode 6 which can be implemented as a rotary table, is disposed a substrate 8 which is treated by the plasma generated between the anode and cathode. The treatment can comprise coating or etching the substrate 8 out of the plasma. The cathode 5 is connected through a line 9 to the negative potential of a power supply 11 while the anode via a line 10 is at the positive potential of this power supply 11.

The cathode 5 is, in addition, connected to a pulsed power source 12 whose output potential is superimposed on the negative potential of the power supply 11. The output potential of the negative power supply 11 is for example $U_{K0} = -500$ volts while the potential of the pulsed power source 12 is approximately $U_p = +510$ to 600 volts so that a $\Delta U_K$ results of approximately +10 to 100 volts.

Figure 2:
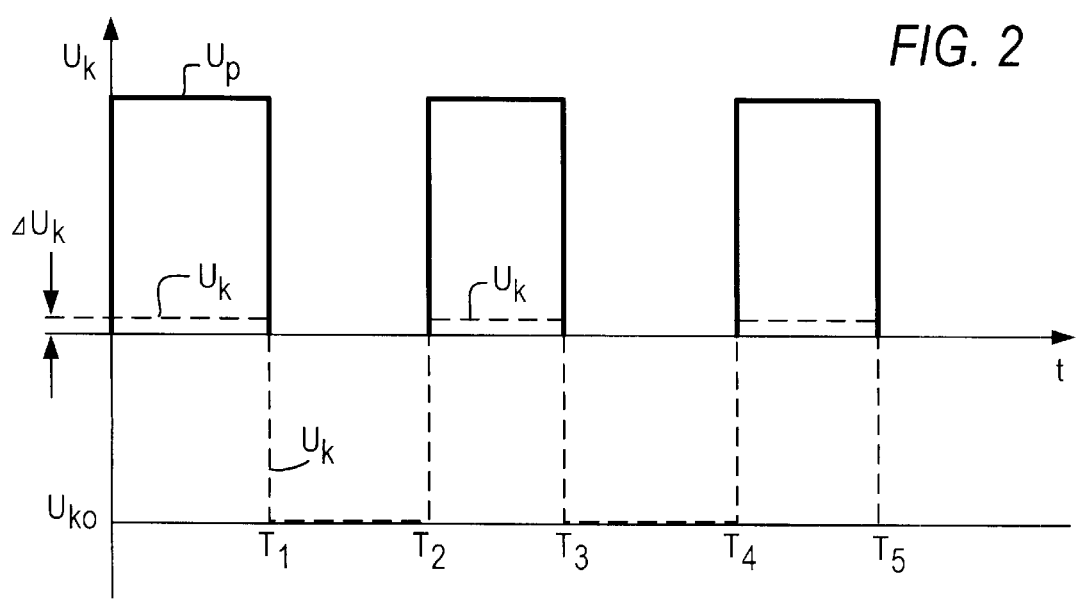
FIG. 2 a basic diagram of two cathode potentials superimposed one on the other.

In FIG. 2 is depicted in greater detail the trace of the potential at cathode 5. On the negative DC voltage potential $U_{K0}$ of the power supply 11 is superimposed a pulse-form voltage $U_p$ from the pulsed power source 12. This pulse-form voltage $U_p$ is depicted above the t-axis as it arrives from the pulsed power source 12, i.e. without superposition. The resulting cathode voltage $U_k$ is shown in dashed lines in FIG. 2. It can be seen that the potential, negative per se, of the power supply 11 at cathode 5 from time to time is brought to a positive potential. For example during time $T_1$ to $T_2$ a negative potential $U_{K0}$ is present at cathode 5 and subsequently between $T_2$ to $T_3$ is brought to a positive potential. The pulse-form voltages from the pulsed power source 12 have positive amplitudes which are greater by $\Delta U_K$ than the negative amplitude of the DC voltage $U_{K0}$. Hereby during time $T_2$ to $T_3$ a voltage which overall is positive of magnitude $\Delta U_K$, results at cathode 5. Through this voltage a discharge of the stated small capacitors at the target takes place so that a breakdown of these capacitors, and consequently also arcing, is prevented.

The state of a pulse, for example $T_3$ to $T_2$ is, for example, less than 100 $\mu$s while the time between two pulses is its 100 to 1000-fold.

The width and intervals of the pulses from the pulse power source 12 can be selected in any desired way.

Figure 3:
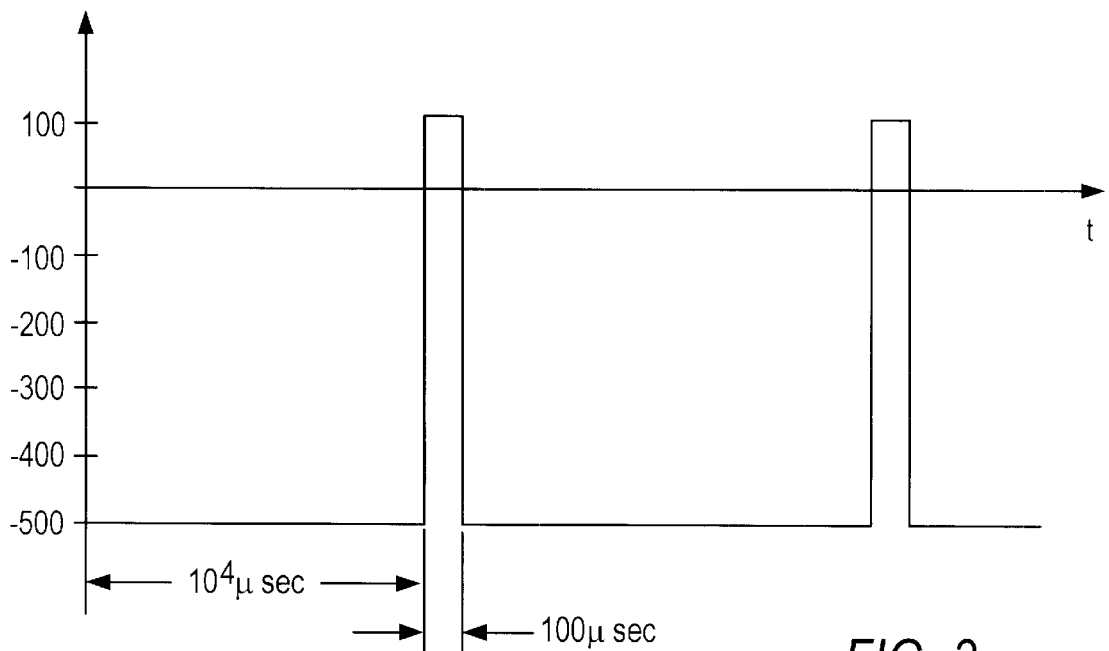
FIG. 3 a resulting cathode voltage.

In FIG. 3 is again depicted the superimposed cathode voltage $U_K$ with concrete time and amplitude values. It is clearly evident herein that the positive voltage pulses occur only for a relatively short time.

Figure 4:
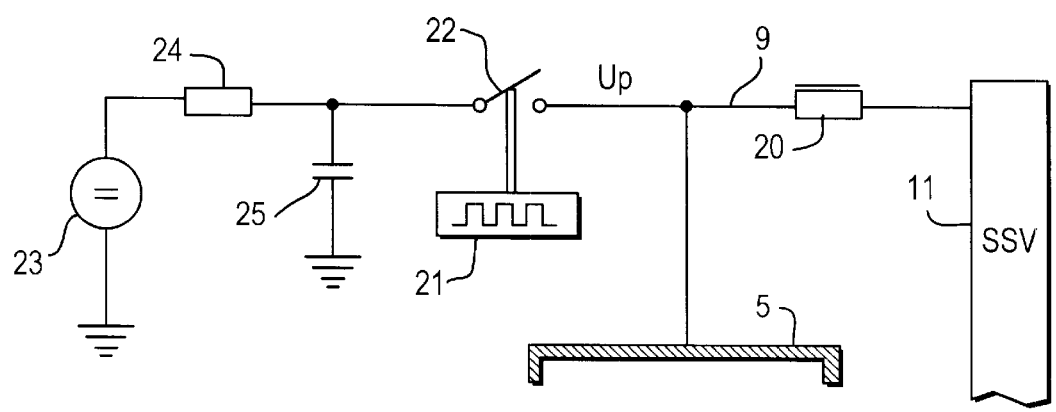
FIG. 4 a pulse generator control for a cathode.

FIG. 4 shows further details of the pulse control. Between first power supply 11 and cathode 5 is interconnected 20 which effects inter alia a current limitation. The pulse generator itself is implemented as a control 21 which opens and closes a switch 22 at given times and hereby outputs the voltage of a second DC voltage source 23 via a resistor 24 to electrode 5 or isolates the voltage from it. It is understood that the control 21 can be layed out so that the pulse-clock ratio can be set in any desired way. A capacitor in parallel to the voltage source 23 is layed out so that it supplies a voltage with the required amplitude. The switch 22 can be realized as a tube, thyristor or transistor.

Laying out the configuration takes placed so that a current of the magnitude of the cathode current can be drive over the desired pulse time from the capacitor 25, for example the cathode current $I_K=-50$ A at a $\Delta U_K$ of 100 volts and a pulse length of 10 $\mu$s. The capacitance of capacitor 25 can consequently be calculated from $$i_o = C \cdot du_o/dt \text{ or } C = i_o dt/du_o.$$

The result is $$C = 50 \text{ A} \cdot 10^{-5} \text{ s}/100 \text{ V} = 5 \text{ } \mu\text{F}.$$

What is claimed is:

1. Device for the prevention of arcing in vacuum sputtering installations, said device comprising:
   a cathode;
   a first DC voltage source providing a negative potential which is connected to said cathode, said negative potential having a magnitude,
   an inductor connected in series between said first DC voltage source and said cathode,
   a second DC voltage source having a positive electrode connected directly to said cathode, said second DC voltage source having a positive potential with a magnitude which is greater than the magnitude of the negative potential of said first DC voltage source by a magnitude of $\Delta U_K$,
   a capacitor connected in parallel with said second DC voltage source,
   a controllable switch between said positive electrode of said second DC voltage source, and
   pulse generating means for closing and opening said switch periodically.

2. Device as stated in claim 1, in which the vacuum sputtering installation (1) includes an anode.

3. Device as stated in claim 2, in which the reference potential is a chassis.

4. Device as stated in claim 2, in which the reference potential is ground.

5. Device is stated in claim 1 in which the controllable switch is a thyristor.

6. Device as stated in claim 1, in which the capacitance of the capacitor is 5 $\mu$F.

7. Device as in claim 1 wherein said capacitor can carry a positive voltage having a magnitude which is higher than the magnitude of the negative potential of said first DC voltage source.

8. Device as in claim 1 wherein said capacitor has a capacitance C calculated according to $C = i_o dt/du_o$, wherein $i_o$ is cathode current, dt is pulse time during which the switch is periodically closed, and $du_o$ is the magnitude $\Delta U_K$.

9. Device as in claim 1 wherein said capacitor has a positive side and a negative side, said negative side being connected to ground, said controllable switch being located between said positive side and said cathode.

* * * * *

UNITED STATES PATENT AND TRADEMARK OFFICE
CERTIFICATE OF CORRECTION

PATENT NO. : 6,440,281 B1
DATED : August 27, 2002
INVENTOR(S) : Sturmer et al.

It is certified that error appears in the above-identified patent and that said Letters Patent is hereby corrected as shown below:

<u>Column 4,</u>
Line 10, after "source", insert -- and said cathode, --

Signed and Sealed this

Tenth Day of December, 2002

JAMES E. ROGAN
*Director of the United States Patent and Trademark Office*